United States Patent
Takagi et al.

(10) Patent No.: US 10,441,979 B2
(45) Date of Patent: Oct. 15, 2019

(54) CLEANING APPARATUS AND CLEANING METHOD

(71) Applicant: Toshiba Memory Corporation, Minato-ku (JP)

(72) Inventors: Jun Takagi, Yokkaichi (JP); Dai Fukushima, Kuwana (JP); Jun Takayasu, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 228 days.

(21) Appl. No.: 14/937,055

(22) Filed: Nov. 10, 2015

(65) Prior Publication Data

US 2017/0053816 A1    Feb. 23, 2017

Related U.S. Application Data

(60) Provisional application No. 62/208,358, filed on Aug. 21, 2015.

(51) Int. Cl.
| | |
|---|---|
| B08B 1/04 | (2006.01) |
| H01L 21/02 | (2006.01) |
| B08B 1/00 | (2006.01) |
| A46B 13/02 | (2006.01) |
| H01L 21/67 | (2006.01) |

(52) U.S. Cl.
CPC ............... B08B 1/04 (2013.01); A46B 13/02 (2013.01); B08B 1/007 (2013.01); H01L 21/02052 (2013.01); H01L 21/67046 (2013.01)

(58) Field of Classification Search
CPC ............... B08B 1/007; H01L 21/67046; H01L 21/67051
See application file for complete search history.

(56) References Cited

U.S. PATENT DOCUMENTS

| | | | |
|---|---|---|---|
| 7,704,329 B2 | 4/2010 | Kobayashi et al. | |
| 2008/0236634 A1* | 10/2008 | Moriya | H01L 21/67051 134/95.3 |
| 2009/0180086 A1* | 7/2009 | Ryu | B08B 1/007 355/30 |
| 2011/0192420 A1* | 8/2011 | Kurashima | B08B 1/04 134/6 |
| 2015/0034121 A1* | 2/2015 | Ishibashi | H01L 21/67051 134/6 |
| 2016/0243593 A1* | 8/2016 | Tanaka | B08B 1/001 |

FOREIGN PATENT DOCUMENTS

| | | |
|---|---|---|
| JP | 5-347287 | 12/1993 |
| JP | 9-36076 | 2/1997 |
| JP | 2001-54765 | 2/2001 |
| JP | 2007-214282 | 8/2007 |

* cited by examiner

*Primary Examiner* — Spencer E Bell
(74) *Attorney, Agent, or Firm* — Oblon, McClelland, Maier & Neustadt, L.L.P.

(57) ABSTRACT

According to one embodiment, there is provided a cleaning apparatus including a substrate cleaner and a member cleaner. The substrate cleaner has a substrate cleaning member placed over a first region to be opposite a substrate and a second region different from the first region. The member cleaner is placed adjacent to the second region.

18 Claims, 14 Drawing Sheets

CLEANING APPARATUS AND CLEANING METHOD

CROSS-REFERENCE TO RELATED APPLICATIONS

This application is based upon and claims the benefit of priority from U.S. Provisional Application No. 62/208,358, filed on Aug. 21, 2015 the entire contents of which are incorporated herein by reference.

FIELD

Embodiments described herein relate generally to a cleaning apparatus and cleaning method.

BACKGROUND

In forming predetermined patterns on a substrate to manufacture devices, if particles are attaching to the substrate, pattern formation defects may occur. Thus, it is desired to remove particles from the surface of the substrate by cleaning the substrate appropriately.

DETAILED DESCRIPTION

In general, according to one embodiment, there is provided a cleaning apparatus including a substrate cleaner and a member cleaner. The substrate cleaner has a substrate cleaning member placed over a first region to be opposite a substrate and a second region different from the first region. The member cleaner is placed adjacent to the second region.

Exemplary embodiments of a cleaning apparatus will be explained below in detail with reference to the accompanying drawings. The present invention is not limited to the following embodiments.

First Embodiment

A cleaning apparatus 100 according to the first embodiment is used in the process of forming predetermined patterns on a substrate (e.g., a semiconductor substrate) to manufacture devices (e.g., semiconductor devices). The cleaning apparatus 100 cleans the substrate to remove particles on the substrate.

Figure 1:
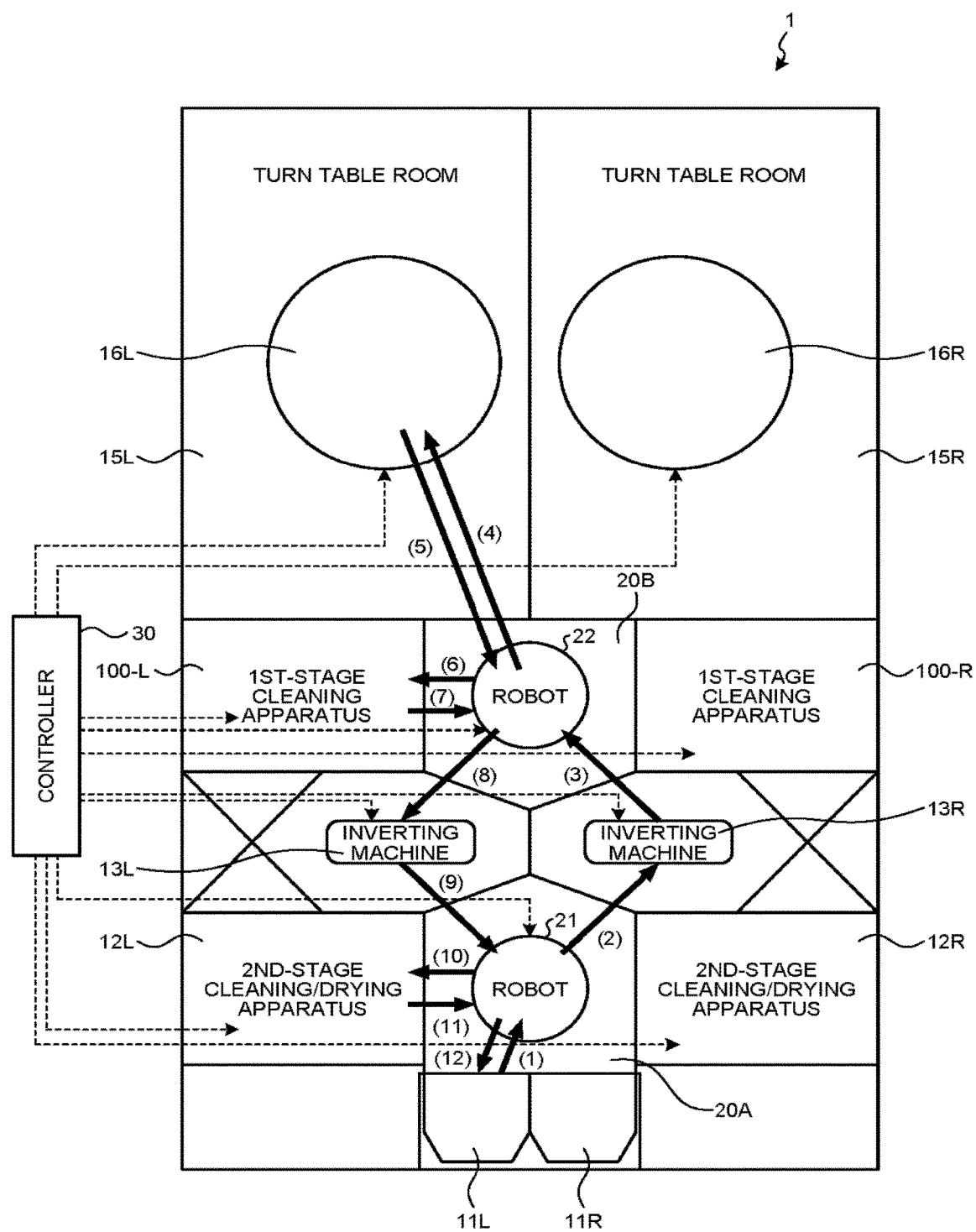
FIG. 1 is a diagram showing the configuration of a CMP apparatus to which a cleaning apparatus according to a first embodiment is applied.

For example, cleaning apparatuses 100 are used in a CMP apparatus 1 as shown in FIG. 1. FIG. 1 is a diagram showing the configuration of the CMP apparatus 1 to which the cleaning apparatus 100 is applied.

In the CMP apparatus 1, because particles are likely to attach to the substrate in polishing a substrate, after polishing, the particles are removed from the surface of the substrate. The CMP apparatus 1 is, for example, a single-wafer processing apparatus comprising two polishing chambers and has turn table rooms 15L, 15R, first-stage cleaning apparatuses 100-L, 100-R, inverting machines 13L, 13R, second-stage cleaning/drying apparatuses 12L, 12R, and robots 21, 22. The cleaning apparatus 100 is applied to each of the first-stage cleaning apparatuses 100-L, 100-R. The constituents of the CMP apparatus 1 are controlled by a controller 30. The controller 30 may be provided in the CMP apparatus 1 or outside the CMP apparatus 1.

The CMP apparatus 1 has a left-side polishing/transport mechanism placed on the left side of the CMP apparatus 1 and a right-side polishing/transport mechanism placed on the right side of the CMP apparatus 1. The left-side polishing/transport mechanism includes the turn table room 15L, the first-stage cleaning apparatus 100-L, the inverting machines 13L, 13R, the second-stage cleaning/drying apparatus 12L, and the robots 21, 22. The right-side polishing/transport mechanism includes the turn table room 15R, the first-stage cleaning apparatus 100-R, the inverting machines 13L, 13R, the second-stage cleaning/drying apparatus 12R, and the robots 21, 22.

A cassette 11L storing a substrate SB is set near a substrate inlet/outlet port of the left-side polishing/transport mechanism, and a cassette 11R storing a substrate SB is set near a substrate inlet/outlet port of the right-side polishing/transport mechanism.

The robot 21 is placed in a robot placed room 20A and transfers the substrate SB under the control of the controller 30. The robot placed room 20A is in communication with the substrate inlet/outlet ports (the cassettes 11L, 11R), the second-stage cleaning/drying apparatuses 12L, 12R, and the inverting machines 13L, 13R. The robot 21 transfers the substrate SB between the cassettes 11L, 11R, the second-stage cleaning/drying apparatuses 12L, 12R, and the inverting machines 13L, 13R.

The robot 22 is placed in a robot placed room 20B and transfers the substrate SB under the control of the controller 30. The robot placed room 20B is in communication with the turn table rooms 15L, 15R, the first-stage cleaning apparatuses 100-L, 100-R, and the inverting machines 13L, 13R. The robot 22 transfers the substrate SB between the turn table rooms 15L, 15R, the first-stage cleaning apparatuses 100-L, 100-R, and the inverting machines 13L, 13R.

The inverting machine 13R turns over the substrate SB transferred thereto by the robot 21 under the control of the controller 30, so that, e.g., the back side of the substrate SB faces upward. The inverting machine 13L turns over the substrate SB transferred thereto by the robot 22, so that, e.g., the front side of the substrate SB faces upward.

The turn table room 15L is a polishing chamber comprising a turn table 16L, and the turn table room 15R is a polishing chamber comprising a turn table 16R. Pads are mounted on the tops of the turn tables 16L, 16R, and the substrate SB on its to-be-polished side is mounted on the top of the pad. The to-be-polished side of the substrate SB is polished with the pad under the control of the controller 30. Further, after one substrate SB is polished, and before the next substrate SB is polished, the surface of the pad is ground by a dresser under the control of the controller 30.

The first-stage cleaning apparatus 100-L, 100-R cleans the substrate SB using a substrate cleaning member (e.g., a cleaning roll having a cleaning body such as a sponge provided on its surface) or the like under the control of the controller 30. The second-stage cleaning/drying apparatus 12L, 12R cleans the substrate SB using another substrate cleaning member (a cleaning pencil having a cleaning body such as a sponge provided on its tip) or the like and spin dries the substrate SB under the control of the controller 30.

In performing cleaning (e.g., cleaning by the cleaning roll), dust (particles) such as fallen abrasive grains brought in from a polisher (the turn table 16L, 16R) may be accumulated in the first-stage cleaning apparatus 100-L, 100-R so as to be transferred onto the substrate SB. For example, particles removed from the substrate SB by cleaning may attach to the substrate SB again. In forming predetermined patterns on the substrate SB to manufacture devices, if particles are attaching to the substrate SB, pattern formation defects or faults such as shorts may occur. In order to suppress pattern formation defects or faults such as shorts, it is desired to improve the capability to clean of the cleaning apparatus 100 so as to clean the substrate SB appropriately to remove particles from the surface of the substrate SB.

Accordingly, in the first embodiment, the cleaning apparatus 100, while cleaning the substrate SB by the substrate cleaning member, in parallel, cleans the substrate cleaning member, thereby improving the capability to clean of the cleaning apparatus 100.

Figure 2:
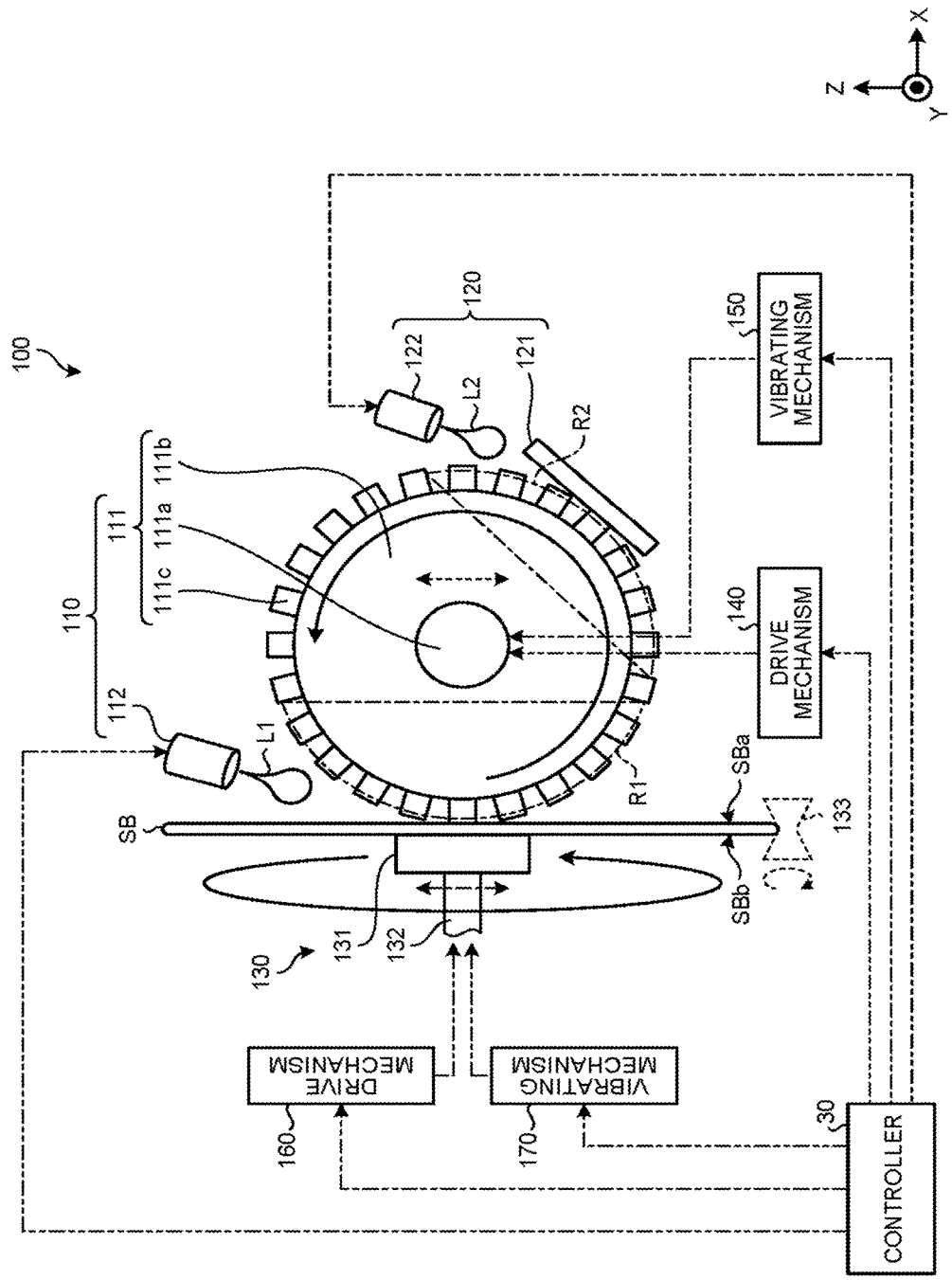
FIG. 2 is a diagram showing the configuration of the cleaning apparatus according to the first embodiment.

Specifically, as shown in FIG. 2, the cleaning apparatus 100 has a substrate cleaner 110, a member cleaner 120, a holding mechanism 130, a drive mechanism 140, a vibrating mechanism 150, a drive mechanism 160, and a vibrating mechanism 170. FIG. 2 is a diagram showing the configuration of the cleaning apparatus 100. In FIG. 2, let a Z direction be a direction pointing vertically upward and X and Y directions be two orthogonal directions in a plane perpendicular to the Z direction.

The substrate cleaner 110 has regions R1 and R2. The region R1 is a region to be opposite the substrate SB of the substrate cleaner 110. The substrate SB is cleaned by part of the substrate cleaner 110 passing through the region R1. The region R2 is a region different from the region R1 in the substrate cleaner 110 and, for example, a region opposite to the region R1 in the substrate cleaner 110. The member cleaner 120 is placed adjacent to the region R2 to clean part of the substrate cleaner 110 in the region R2.

Figure 3:
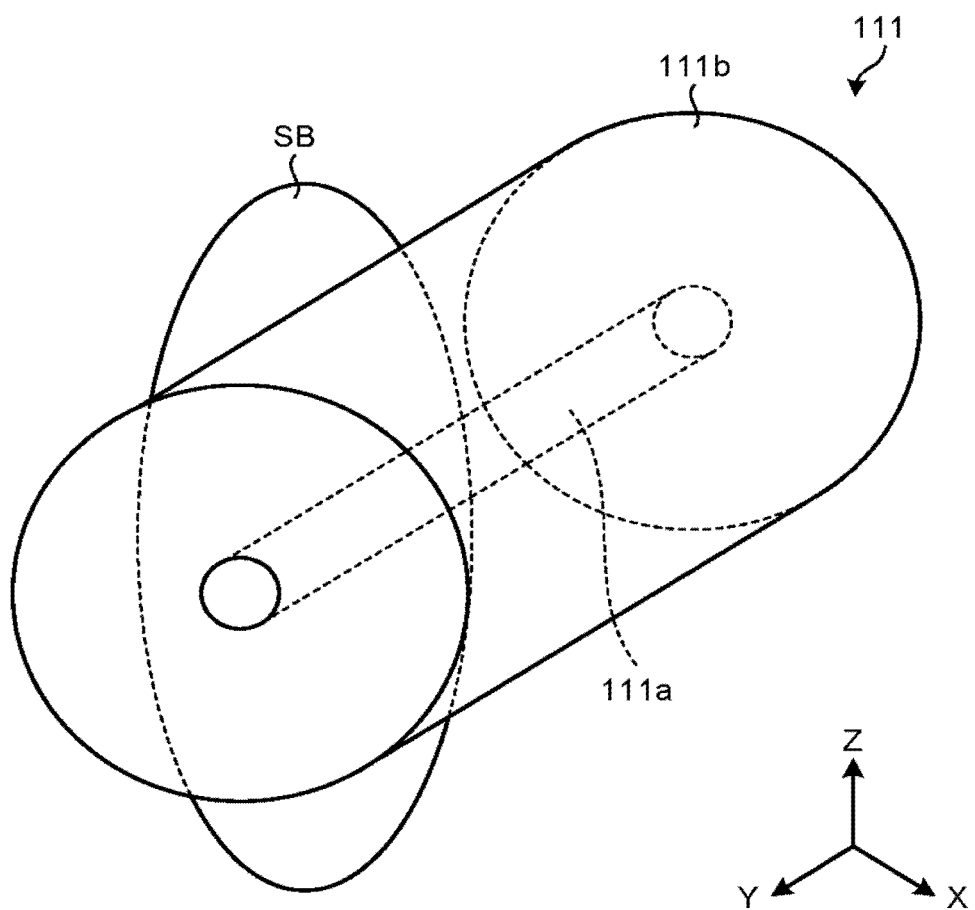
FIG. 3 is a diagram showing the configuration of a substrate cleaning member (cleaning roll) in the first embodiment.

The substrate cleaner 110 has a substrate cleaning member 111 and a supply nozzle 112. At least the adjacent-to-the-surface portion of the substrate cleaning member 111 passes through the regions R1 and R2 alternately and repeatedly. The substrate cleaning member 111 includes, for example, a roll-shaped substrate cleaning member (cleaning roll) as shown in FIGS. 2 and 3. FIG. 3 is a diagram showing the configuration of the substrate cleaning member 111.

As shown in FIG. 2, the substrate cleaning member 111 has a core 111a, a member body 111b, and a group of protrusions 111c. The core 111a has a substantially cylindrical shape having the center axis along the Y axis, is rotatably supported by the drive mechanism 140 and the vibrating mechanism 150, and is configured to be rotatable by receiving rotative force from the drive mechanism 140. Further, the core 111a vibrates by receiving vibration force from the vibrating mechanism 150.

The member body 111b has a substantially cylindrical shape having the center axis along the Y axis, surrounds the core 111a, and is fixed to the core 111a. The member body 111b is configured to rotate together with the core 111a when the core 111a receives rotative force. The member body 111b is configured to vibrate together with the core 111a when the core 111a receives vibration force.

The group of protrusions 111c are formed of flexible material to have permeability. The group of protrusions 111c are made of material, e.g., PVA (polyvinyl alcohol) or the like and formed to be porous (like a sponge). The group of protrusions 111c are placed on the rim surface of the member body 111b as a group of multiple wart-shaped protrusions. In ZX cross-sectional view, the multiple protrusions are provided on the rim surface of the member body 111b to be radial with the core 111a in the center. Note that in FIG. 3, for simplicity of illustration, the group of protrusions 111c are omitted from the figure.

As shown in FIG. 2, when the member body 111b is driven to rotate via the core 111a, the substrate cleaning member 111 has the protrusions 111c touch the to-be-cleaned surface SBa of the substrate SB. At this time, the drive mechanism 140 can drive the core 111a to rotate in such a way as to press the protrusions 111c against the substrate SB via the core 111a and the member body 111b. Thus, the protrusions 111c can rub against the to-be-cleaned surface SBa of the substrate SB so as to clean the to-be-cleaned surface SBa of the substrate SB, so that particles can be removed from the to-be-cleaned surface SBa. Further, the vibrating mechanism 150 can vibrate the member body 111b via the core 111a. Thus, the touching area between the protrusions 111c and the substrate SB can be substantially increased, so that the capability to clean the substrate SB of the cleaning apparatus 100 can be improved.

The supply nozzle 112 supplies a cleaning liquid L1 for cleaning the substrate SB to the region R2 under the control of the controller 30 while the substrate cleaning member 111 is cleaning the substrate SB. The cleaning liquid L1 may be, for example, pure water, functional water, or an organic solvent such as alcohol. The functional water is a liquid having hydrogen, ozone, or the like dissolved therein and effective in suppressing the oxidation of the substrate SB. The supply nozzle 112 supplies the cleaning liquid L1, e.g., from above the touching area between the substrate cleaning member 111 and the substrate SB to the touching area.

The member cleaner 120 cleans ones passing through the region R2 of the protrusions 111c of the substrate cleaning member 111. That is, the adjacent-to-the-surface portion (protrusions 111c) of the substrate cleaning member 111 cleans the substrate SB while passing through the region R1 and is cleaned up by the member cleaner 120 while passing through the region R2. Thus, the cleaning apparatus 100 can perform cleaning the substrate SB by the substrate cleaning member 111 and cleaning the substrate cleaning member 111 by the member cleaner 120 in parallel. For example, where the group of protrusions 111c of the substrate cleaning member 111 has first and second parts, the cleaning apparatus 100 performs cleaning the substrate SB by the first part and cleaning the second part in parallel and then performs cleaning the substrate SB by the second part and cleaning the first part in parallel. Therefore, particles from the substrate SB having attached to ones of the protrusions 111c in the region R1 can be removed in the region R2, and hence particles from the protrusions 111c that attach to the substrate SB again when the ones of the protrusions 111c pass through the region R1 the next time can be reduced in number.

The member cleaner 120 has a touching member 121 and a supply nozzle 122. The member cleaner 120 has the touching member 121 physically touch the surface of the substrate cleaning member 111 to clean the substrate cleaning member 111. The touching member 121 is made of material having certain hardness and formed to have a shape corresponding to the substrate cleaning member 111. The touching member 121 is, for example, a quartz plate and formed in a plate shape having the same width along the Y direction as that of the substrate cleaning member 111. In this case, the drive mechanism 140 can drive the core 111a to rotate in such a way as to press the protrusions 111c against the touching member 121 via the core 111a and the member body 111b. Thus, the member cleaner 120 can have the touching member 121 physically touch the surface of the substrate cleaning member 111 to clean the substrate cleaning member 111.

The supply nozzle 122 supplies a cleaning liquid L2 for cleaning the substrate cleaning member 111 to the region R2 under the control of the controller 30 while the touching member 121 is cleaning the substrate cleaning member 111. The cleaning liquid L2 may be, for example, pure water. The supply nozzle 112 supplies the cleaning liquid L2, e.g., from above the touching area between the touching member 121 and the substrate cleaning member 111 to the touching area.

The drive mechanism 140 drives the core 111a to rotate under the control of the controller 30. The direction of the rotation is, for example, the direction of rotation about the Y axis as shown in FIG. 2. The vibrating mechanism 150 vibrates the core 111a under the control of the controller 30. The direction of the vibration can be any direction and may be, for example, the Z direction as indicated by a broken-line arrow in FIG. 2. The rotary drive of the core 111a by the drive mechanism 140 and the vibration of the core 111a by the vibrating mechanism 150 can be performed in parallel.

The holding mechanism 130 holds the substrate SB. The holding mechanism 130 holds the substrate SB from the not-to-be-cleaned surface SBb side in such a position that the to-be-cleaned surface SBa of the substrate SB is substantially parallel to the YZ plane. For example, the holding mechanism 130 has an attraction mechanism 131 such as a vacuum suction mechanism or an electrostatic attraction mechanism and a rotating shaft 132 fixed to the attraction mechanism 131. The holding mechanism 130 holds the substrate SB by the attraction mechanism 131 attracting the not-to-be-cleaned surface SBb of the substrate SB to attach thereto. The rotating shaft 132 has a substantially cylindrical shape having the center axis along the X axis, is rotatably supported by a drive mechanism 160 and a vibrating mechanism 170, and is configured to be rotatable by receiving rotative force from the drive mechanism 160. Further, the rotating shaft 132 vibrates by receiving vibration force from the vibrating mechanism 170.

The drive mechanism 160 drives the rotating shaft 132 to rotate under the control of the controller 30. The direction of the rotation is, for example, the direction of rotation about the X axis as shown in FIG. 2. The vibrating mechanism 170 vibrates the rotating shaft 132 under the control of the controller 30. The direction of the vibration can be any direction and may be, for example, the Z direction as indicated by a dot-dashed arrow in FIG. 2. The rotary drive of the rotating shaft 132 by the drive mechanism 160 and the vibration of the rotating shaft 132 by the vibrating mechanism 170 can be performed in parallel.

The vibration of the core 111a by the vibrating mechanism 150 and the vibration of the rotating shaft 132 by the vibrating mechanism 170 can be performed synchronously with each other. For example, by synchronizing the vibration of the core 111a by the vibrating mechanism 150 and the vibration of the rotating shaft 132 by the vibrating mechanism 170 to be opposite in phase to each other, the touching area between the protrusions 111c and the substrate SB can be increased efficiently.

Figure 4:
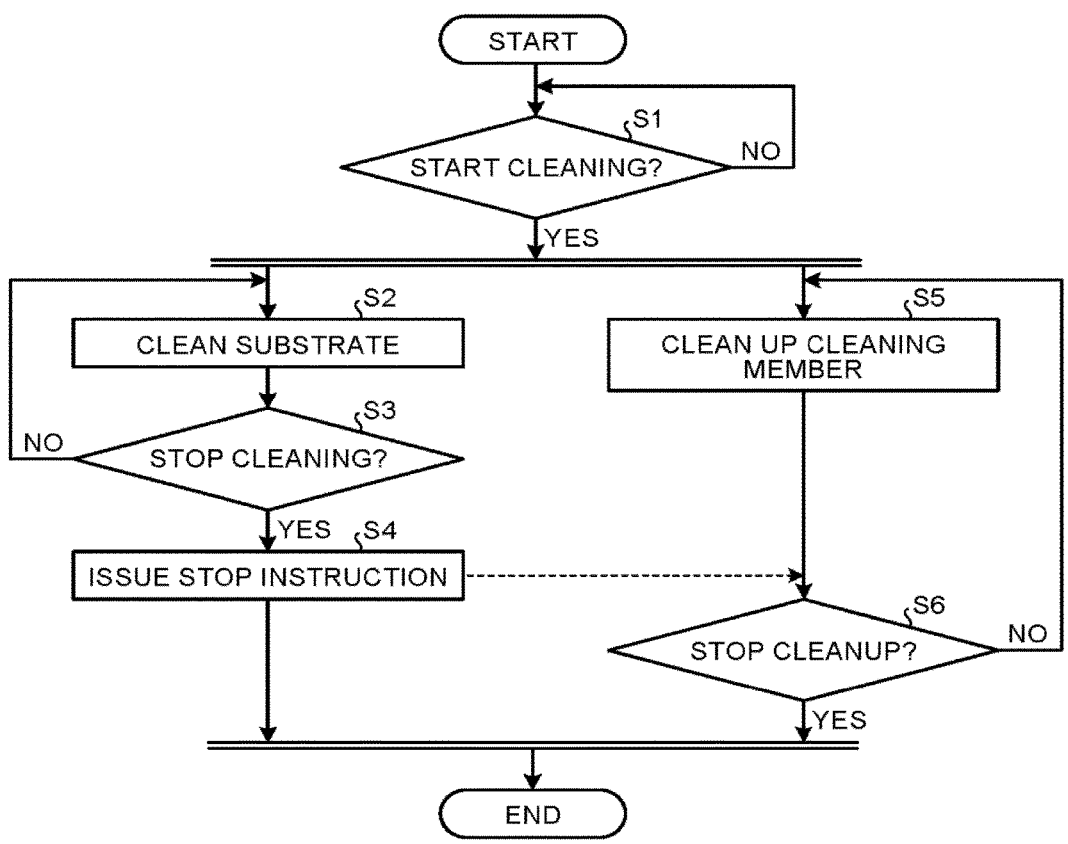
FIG. 4 is a flow chart showing the operation of the cleaning apparatus according to the first embodiment.

Next, the operation of the cleaning apparatus 100 will be described using FIG. 4. FIG. 4 is a flow chart showing the operation of the cleaning apparatus 100.

The controller 30 waits until receiving a cleaning start instruction (while No at S1) and, when receiving a cleaning start instruction (Yes at S1), has the process of S2 to S4 and the process of S5 to S6 performed in parallel.

That is, the drive mechanism 140 drives the core 111a to rotate. The vibrating mechanism 150 vibrates the core 111a. Thus, the substrate cleaner 110, while supplying the cleaning liquid L1 through the supply nozzle 112, rubs part passing through the region R1 of the substrate cleaning member 111 against the to-be-cleaned surface SBa of the substrate SB with vibrating the substrate cleaning member 111 so as to clean the to-be-cleaned surface SBa of the substrate SB (S2). In parallel with this, the member cleaner 120, while supplying the cleaning liquid L2 through the supply nozzle 122, cleans part passing through the region R2 of the substrate cleaning member 111 (S5).

When receiving a cleaning stop instruction (Yes at S3), the controller 30 issues a stop instruction to stop operation to each of the supply nozzle 112, supply nozzle 122, drive mechanism 140, vibrating mechanism 150, drive mechanism 160, and vibrating mechanism 170. The supply nozzle 112, drive mechanism 140, vibrating mechanism 150, drive mechanism 160, and vibrating mechanism 170 receive the stop instruction (S4) so as to stop cleaning operation. In parallel with this, the supply nozzle 122, drive mechanism 140, and vibrating mechanism 150 receive the stop instruction (Yes at S6) so as to stop cleanup operation.

The controller 30 does not issue a stop instruction until receiving a cleaning stop instruction (while No at S3). Thus, the supply nozzle 112, drive mechanism 140, vibrating mechanism 150, drive mechanism 160, and vibrating mechanism 170 do not receive a stop instruction, and they continue cleaning operation (S2). The supply nozzle 122, drive mechanism 140, and vibrating mechanism 150 do not receive a stop instruction (No at S6), and they continue cleanup operation (S5).

As described above, in the first embodiment, cleaning apparatus 100, while cleaning the substrate SB by the roll-shaped substrate cleaning member 111 (a cleaning roll), in parallel, cleans the substrate cleaning member 111. For example, where the adjacent-to-the-surface portion of the substrate cleaning member 111 has first and second parts, cleaning the substrate SB by the first part and cleaning the second portion are performed in parallel, and then cleaning the substrate SB by the second portion and cleaning the first portion are performed in parallel. That is, the adjacent-to-the-surface portion of the substrate cleaning member 111 cleans the substrate SB while passing through the region R1 and is cleaned by the member cleaner 120 while passing through the region R2. Thus, particles from the substrate SB having attached to ones of the protrusions 111c in the region R1 can be removed in the region R2, and hence particles from the protrusions 111c that attach to the substrate SB again when the ones of the protrusions 111c pass through the region R1 the next time can be reduced in number. As a result, the capability to clean of the cleaning apparatus 100 can be improved, so that pattern formation defects or faults such as shorts in the substrate SB can be suppressed.

Further, in the first embodiment, in the cleaning apparatus 100, the member cleaner 120 has the touching member 121 physically touch the surface of the substrate cleaning member (cleaning roll) 111 in the region R2 to clean the substrate cleaning member 111. Thus, particles from the substrate SB having attached to ones of the protrusions 111c in the region R1 can be removed in the region R2.

It should be noted that, although the case where the cleaning apparatus 100 is applied to the CMP apparatus 1 is illustrated in FIG. 1, the cleaning apparatus 100 can be applied to other apparatuses which need the cleaning of substrates. The cleaning apparatus 100 may be used, for example, in cleaning a substrate after the substrate is exposed and developed and then a resist is separated from the substrate.

Or either of the vibration of the core 111a by the vibrating mechanism 150 and the vibration of the rotating shaft 132 by the vibrating mechanism 170 may be performed. For example, the vibration of the rotating shaft 132 by the vibrating mechanism 170 may be performed without performing the vibration of the core 111a by the vibrating mechanism 150. Or, for example, the vibration of the core 111a by the vibrating mechanism 150 may be performed without performing the vibration of the rotating shaft 132 by the vibrating mechanism 170. In this case, the holding mechanism 130 may have a roller 133 indicated by a broken line in FIG. 2 as a mechanism to hold the substrate SB instead of the attraction mechanism 131 and the rotating shaft 132. The substrate SB on its −Z side edge is mounted on the roller 133. The drive mechanism 160 drives the roller 133 to rotate under the control of the controller 30. The direction of the rotation is, for example, the direction of rotation about the X axis as shown in FIG. 2. Thus, the roller 133 holds and rotates the substrate SB.

Or the member cleaner may have a liquid supplying member instead of the touching member 121. That is, the member cleaner may supply liquid from the liquid supplying member to the surface of the substrate cleaning member 111 to perform cleaning instead of having the touching member 121 physically touch the surface of the substrate cleaning member 111 to perform cleaning. The liquid supplying member supplies liquid to the surface of the substrate cleaning member (cleaning roll) 111 in the region R2 so as to clean the substrate cleaning member 111. Thus, particles from the substrate SB having attached to ones of the protrusions 111c in the region R1 can be removed in the region R2.

Figure 5:
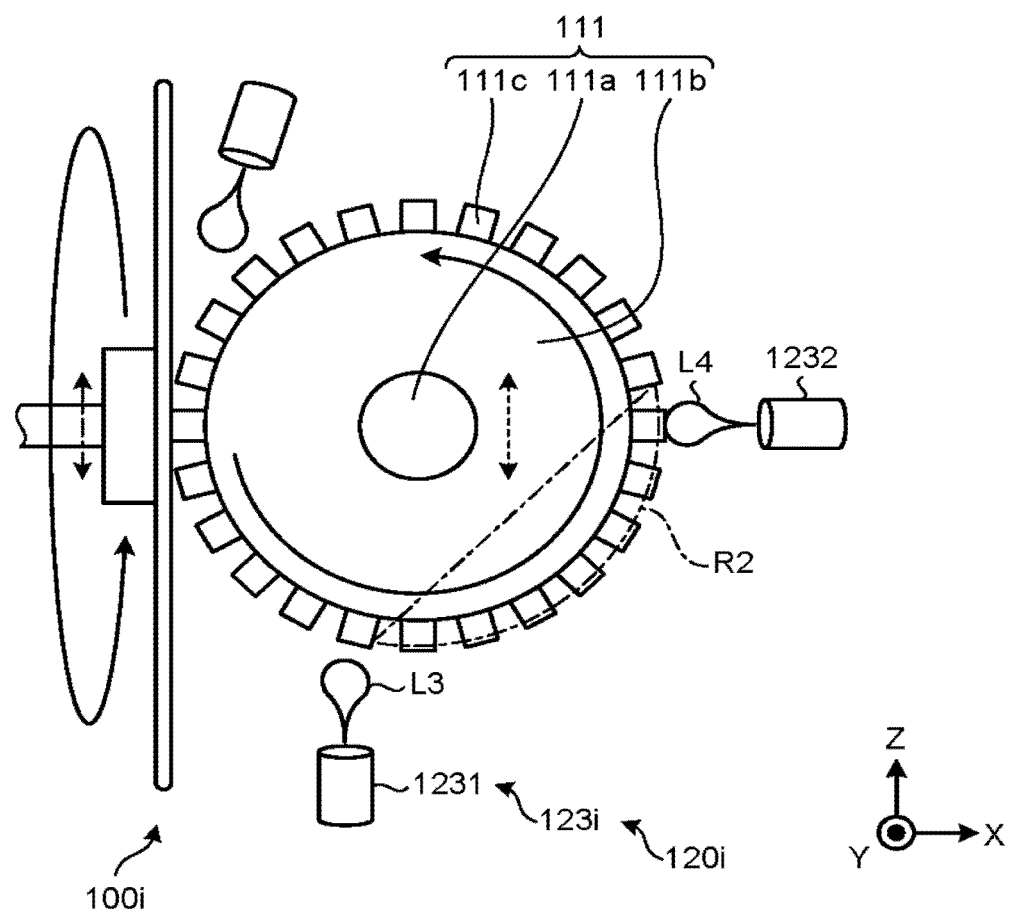
FIG. 5 is a diagram showing the configuration of a cleaning apparatus according to a modified example of the first embodiment.

For example, as shown in FIG. 5, in a cleaning apparatus 100i, a member cleaner 120i has a liquid supplying member 123i. FIG. 5 is a diagram showing the configuration of the cleaning apparatus 100i. The liquid supplying member 123i has supply nozzles 1231, 1232. The supply nozzle 1231 supplies a cleaning liquid L3 to the surface (protrusions 111c) of the substrate cleaning member 111 at a position on the upstream side of the region R2. The cleaning liquid L3 is a liquid for cleaning the substrate cleaning member 111, and a liquid not suitable for cleaning the substrate SB but suitable for cleaning the substrate cleaning member 111 can also be used. The cleaning liquid L3 includes at least one of, e.g., acid, alkali, a surfactant, and pure water. The surfactant includes at least one of a neutral surfactant, an acidic surfactant, and an alkaline surfactant. The supply nozzle 1232 supplies a cleaning liquid L4 to the surface (protrusions 111c) of the substrate cleaning member 111 at a position on the downstream side of the region R2. The cleaning liquid L4 is a liquid for rinsing and for preventing the cleaning liquid L3 from being supplied to the substrate SB. The cleaning liquid L4 includes, e.g., pure water. Thus, while the adjacent-to-the-surface portion of the substrate cleaning member 111 is passing through the region R2, the cleaning liquid L3 is supplied through the supply nozzle 1231 thereto, and then the adjacent-to-the-surface portion is rinsed with the cleaning liquid L4 supplied through the supply nozzle 1232 to be cleaned.

Or in the configuration shown in FIG. 5, the supply nozzle 1231 may be omitted from the liquid supplying member 123i. In this case, the supply nozzle 1232 supplies the cleaning liquid L4 to the surface (protrusions 111c) of the substrate cleaning member 111 in the region R2, thereby cleaning the substrate cleaning member 111. Thus, while the adjacent-to-the-surface portion of the substrate cleaning member 111 is passing through the region R2, the cleaning liquid L4 is supplied through the supply nozzle 1232 to it, so that it is cleaned.

Further, the supply nozzle 1232 may be configured to pressurize and spray liquid onto the surface of the substrate cleaning member (cleaning roll) 111. That is, the supply nozzle 1232 may spray water jets, formed by jetting water finely, onto the surface of the substrate cleaning member 111. Thus, the adjacent-to-the-surface portion of the substrate cleaning member 111 can be cleaned with the pressurized cleaning liquid L4, and hence particles attaching to the protrusions 111c can be removed efficiently.

Or the member cleaner may have a gas supplying member instead of the liquid supplying member. That is, the member cleaner may supply gas from the gas supplying member to the surface of the substrate cleaning member 111 to perform cleaning. For example, the supply nozzle 1232 shown in FIG. 5 may be configured to pressurize and spray gas onto the surface of the substrate cleaning member (cleaning roll) 111. That is, the supply nozzle 1232 may spray gas pressurized by jetting gas finely onto the surface of the substrate cleaning member 111. Thus, the adjacent-to-the-surface portion of the substrate cleaning member 111 can be cleaned with the pressurized gas, and hence particles attaching to the protrusions 111c can be removed efficiently.

Figure 6:
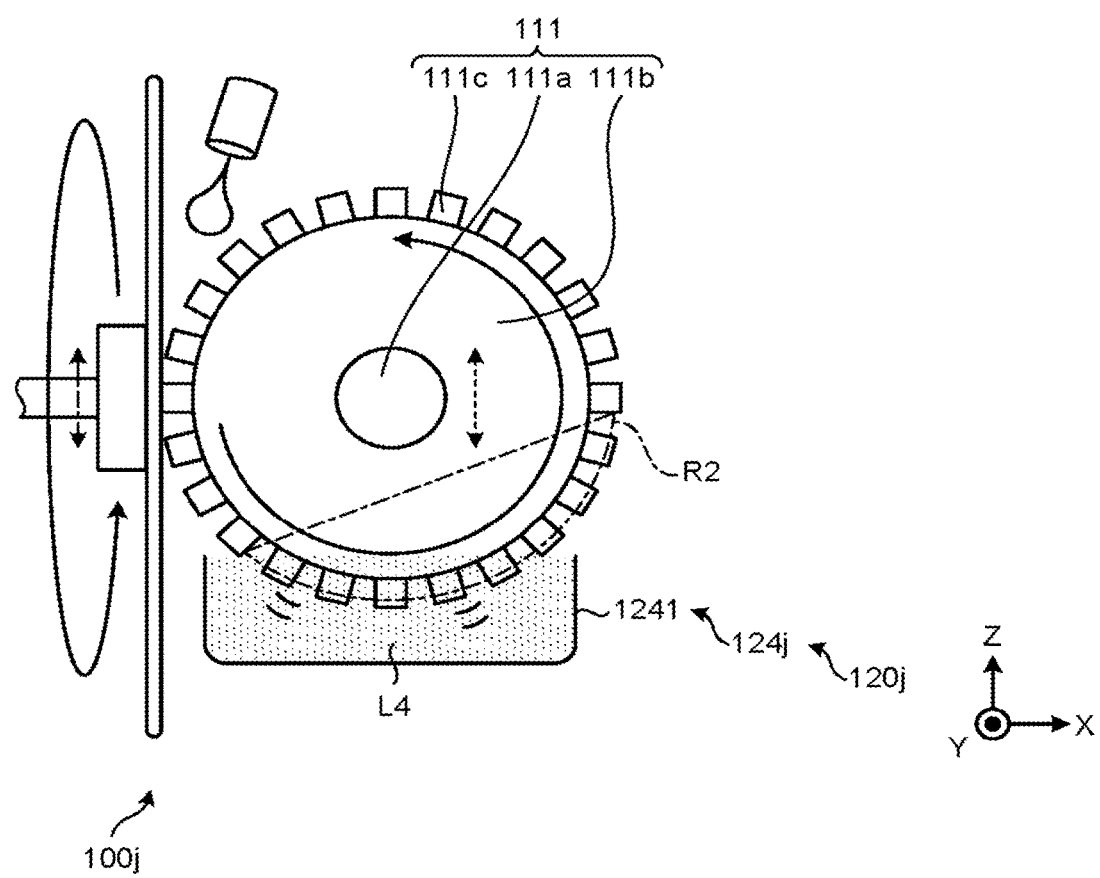
FIG. 6 is a diagram showing the configuration of a cleaning apparatus according to another modified example of the first embodiment.

Or, for example, as shown in FIG. 6, in a cleaning apparatus 100j, a member cleaner 120j has a liquid supplying member 124j. FIG. 6 is a diagram showing the configuration of the cleaning apparatus 100j. The liquid supplying member 124j includes a cleaning bath 1241. The cleaning bath 1241 is for soaking the surface of the substrate cleaning member (cleaning roll) 111 in a liquid. The cleaning bath 1241 is filled with a cleaning liquid L4. The cleaning liquid L4 includes, e.g., pure water. The substrate cleaning member 111 is placed such that while part of the adjacent-to-the-surface portion (protrusions 111c) of the substrate cleaning member 111 is passing through the region R2, the part is located below the liquid surface in the cleaning bath 1241 and, before and after passing through the region R2, above the liquid surface in the cleaning bath 1241. Thus, the adjacent-to-the-surface portion of the substrate cleaning member 111 is soaked in the cleaning liquid L4 in the cleaning bath 1241 to be cleaned while passing through the region R2.

Further, in the configuration shown in FIG. 6, ultrasound generated by an ultrasound generating mechanism (not shown) may be supplied to the cleaning liquid L4 in the cleaning bath 1241. Thus, the adjacent-to-the-surface portion of the substrate cleaning member 111 can be cleaned by ultrasound, and hence particles attaching to the protrusions 111c can be removed efficiently.

Figure 7:
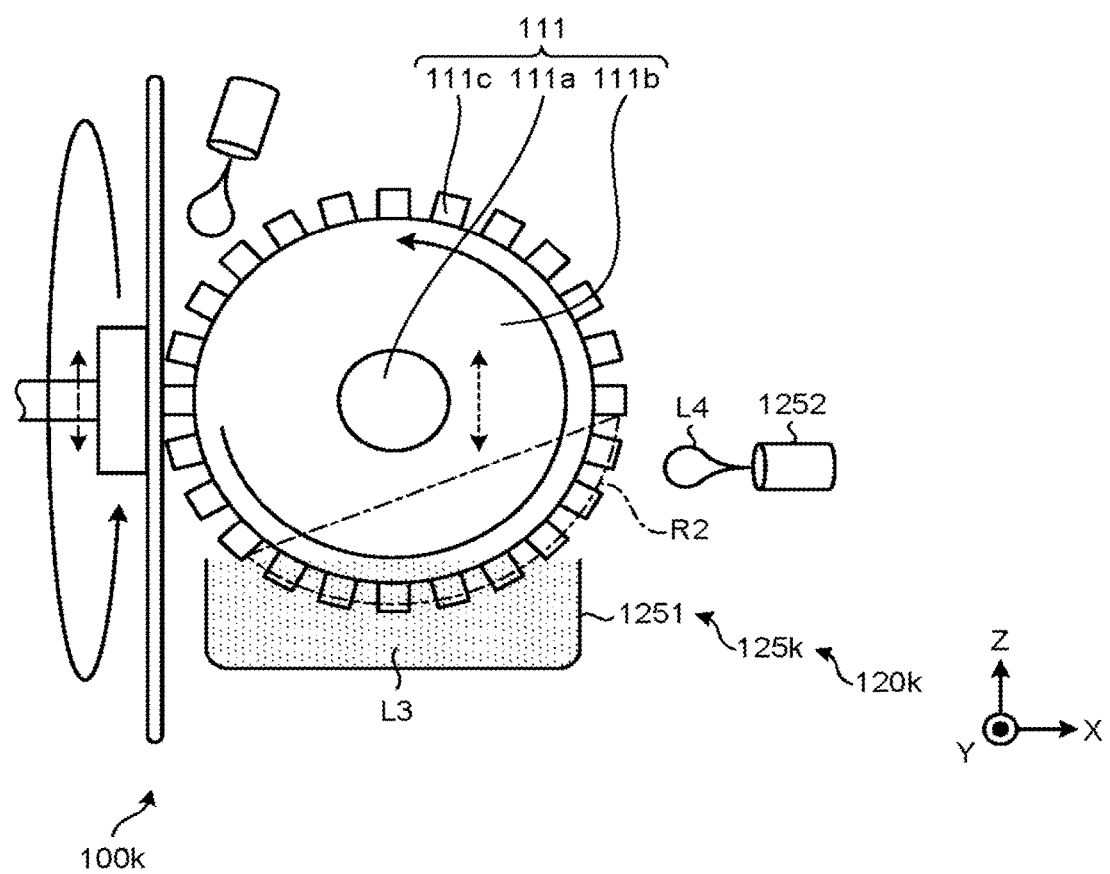
FIG. 7 is a diagram showing the configuration of a cleaning apparatus according to yet another modified example of the first embodiment.

Or, for example, as shown in FIG. 7, in a cleaning apparatus 100k, a member cleaner 120k has a liquid supplying member 125k. FIG. 7 is a diagram showing the configuration of the cleaning apparatus 100k. The liquid supplying member 125k includes a cleaning bath 1251 and a supply nozzle 1252. The cleaning bath 1251 is for soaking the surface of the substrate cleaning member (cleaning roll) 111 in a liquid at a position on the upstream side of the region R2. The cleaning bath 1251 is filled with a cleaning liquid L3. The cleaning liquid L3 includes at least one of, e.g., acid, alkali, a surfactant, and pure water. The surfactant includes at least one of a neutral surfactant, an acidic surfactant, and an alkaline surfactant. The supply nozzle 1252 supplies a cleaning liquid L4 to the surface (protrusions 111c) of the substrate cleaning member 111 at a position on the downstream side of the region R2. The cleaning liquid L4 is a liquid for rinsing and includes, e.g., pure water. Thus, the adjacent-to-the-surface portion of the substrate cleaning member 111 is soaked in the cleaning liquid L3 in the cleaning bath 1251 while passing through the region R2 and then rinsed with the cleaning liquid L4 to be cleaned.

Second Embodiment

A cleaning apparatus 200 according to the second embodiment will be described. Description will be made below focusing on the differences from the first embodiment.

Although the first embodiment illustrates the case where the substrate cleaning member includes a roll-shaped substrate cleaning member (cleaning roll), the second embodiment illustrates the case where the substrate cleaning member includes a sheet-shaped substrate cleaning member (cleaning sheet).

Figure 8:
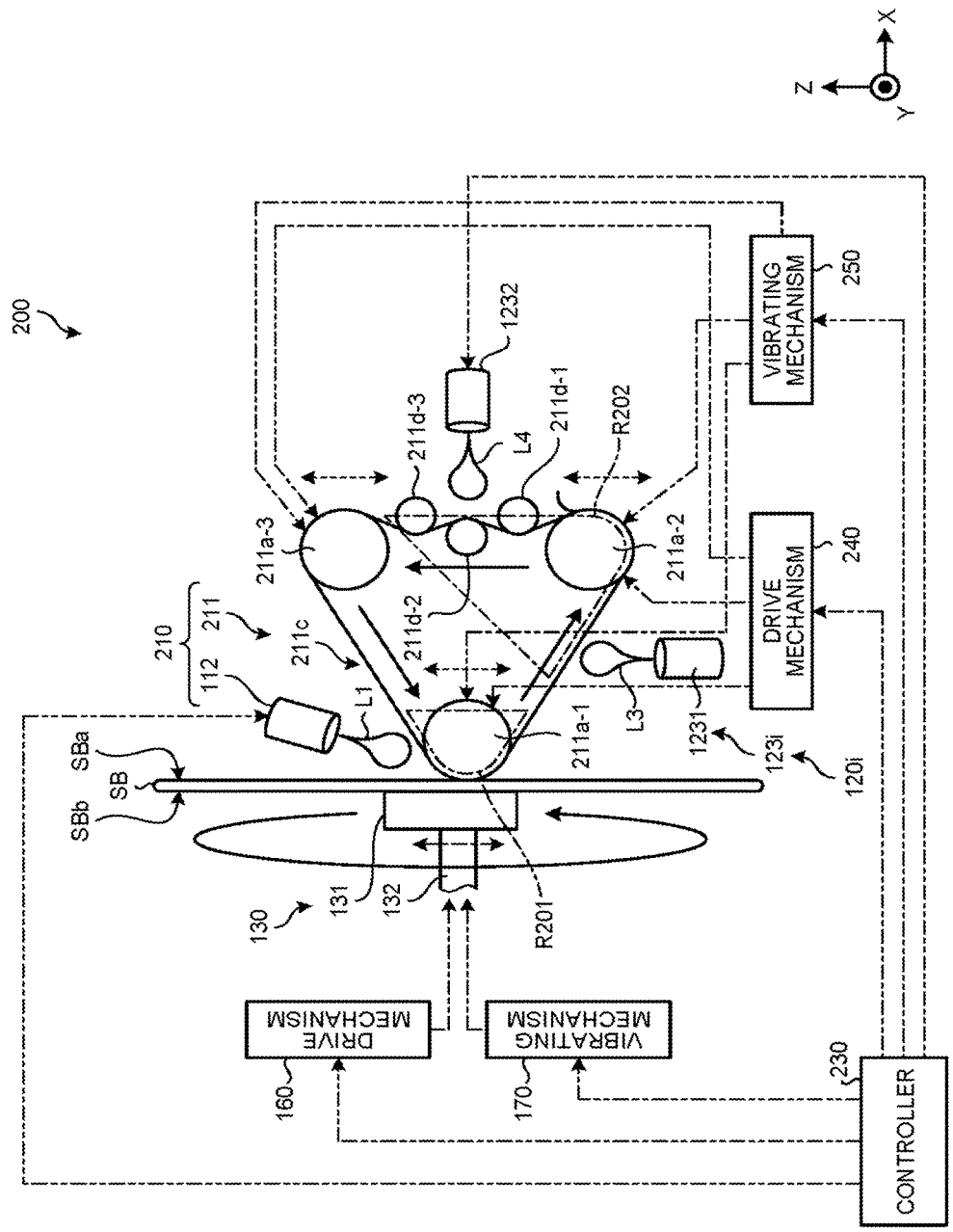
FIG. 8 is a diagram showing the configuration of a cleaning apparatus according to a second embodiment.

Specifically, as shown in FIG. 8, the cleaning apparatus 200 has a substrate cleaner 210, a member cleaner 120i, a holding mechanism 130, a drive mechanism 240, a vibrating mechanism 250, a drive mechanism 160, and a vibrating mechanism 170. FIG. 8 is a diagram showing the configuration of the cleaning apparatus 200. In FIG. 8, let a Z direction be a direction pointing vertically upward and X and Y directions be two orthogonal directions in a plane perpendicular to the Z direction.

The substrate cleaner 210 has regions R201 and R202. The region R201 is a region to be opposite the substrate SB of the substrate cleaner 210. The substrate SB is cleaned by part of the substrate cleaner 210 passing through the region R201. The region R202 is a region different from the region R201 in the substrate cleaner 210 and, for example, a region opposite to the region R201 in the substrate cleaner 210. The member cleaner 120i is placed adjacent to the region R202 to clean part of the substrate cleaner 210 in the region R202. The member cleaner 120i can be of the same configuration as the member cleaner 120i shown in FIG. 5.

Figure 9:
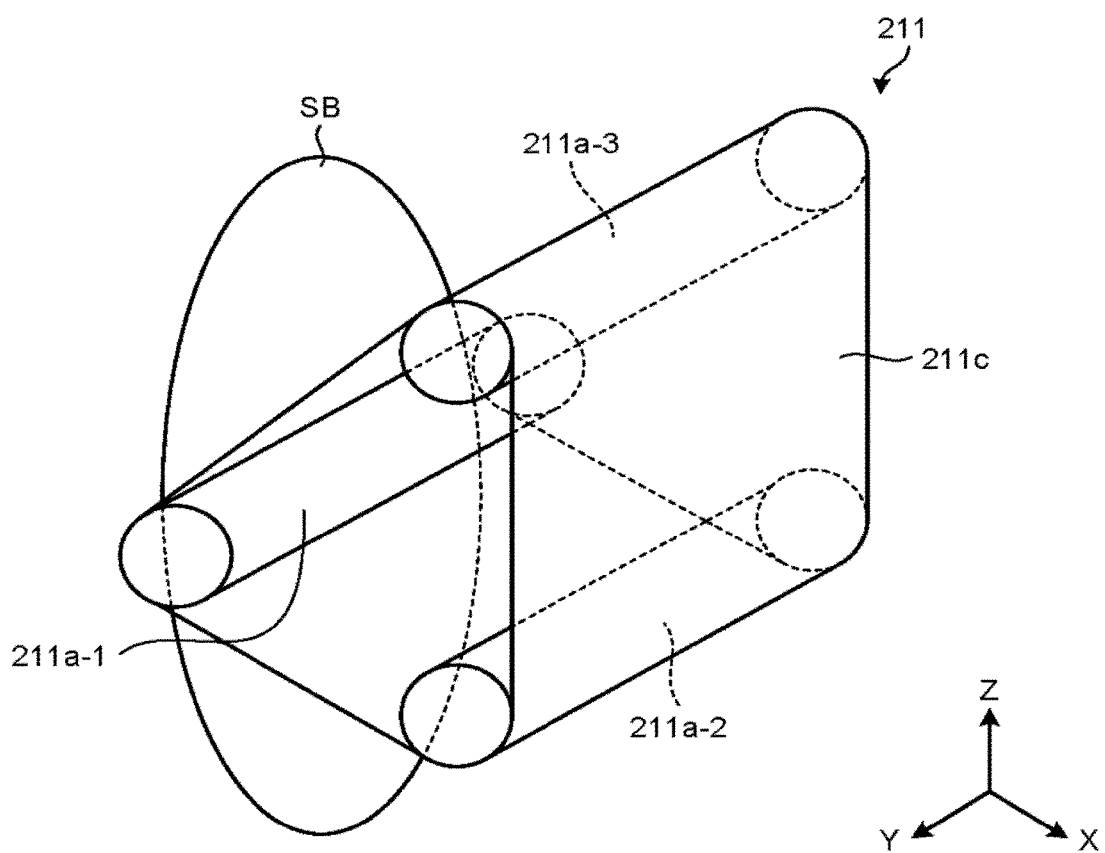
FIG. 9 is a diagram showing the configuration of a substrate cleaning member (cleaning sheet) in the second embodiment.

The substrate cleaner 210 has a substrate cleaning member 211 and a supply nozzle 112. At least the adjacent-to-the-surface portion of the substrate cleaning member 211 passes through the regions R201 and R202 alternately and repeatedly. The substrate cleaning member 211 includes, for example, a sheet-shaped substrate cleaning member (cleaning sheet) as shown in FIGS. 8 and 9. FIG. 9 is a diagram showing the configuration of the substrate cleaning member 211.

As shown in FIG. 9, the substrate cleaning member 211 has multiple cores 211a-1 to 211a-3, a sheet 211c, and multiple subsidiary cores 211d-1 to 211d-3. Each core 211a has a substantially cylindrical shape having the center axis along the Y axis, is rotatably supported by the drive mechanism 240 and the vibrating mechanism 250, and is configured to be rotatable by receiving rotative force from the drive mechanism 240. Further, each core 211a vibrates by receiving vibration force from the vibrating mechanism 250. The multiple cores 211a-1 to 211a-3 can be placed at the positions of vertexes of a polygon in ZX cross-sectional view. For example, three cores 211a-1 to 211a-3 can be placed at the positions of vertexes of a triangle in ZX cross-sectional view (see FIG. 8).

The sheet 211c can be constituted by, e.g., a nonwoven fabric. The sheet 211c is stretched over the outsides of the multiple cores 211a-1 to 211a-3 in such a way as to circumscribe the multiple cores 211a-1 to 211a-3. In ZX cross-sectional view, the sheet 211c forms an approximate polygon circumscribing the multiple cores 211a-1 to 211a-3 (in FIG. 8, an approximate triangle). Note that in FIG. 9, for simplicity of illustration, the multiple subsidiary cores 211d-1 to 211d-3 are omitted from the figure.

The multiple subsidiary cores 211d-1 to 211d-3 shown in FIG. 8 are placed alternately offset to touch the front and back sides of the sheet 211c in ZX cross-sectional view. The multiple subsidiary cores 211d-1 to 211d-3 are placed at positions corresponding to the supply nozzle 1232. For example, the subsidiary cores 211d-1 to 211d-3 are offset from each other in Z position. The X positions of the subsidiary cores 211d-1 to 211d-3 are almost the same, but the X position of the subsidiary cores 211d-1, 211d-3 is offset from that of the subsidiary cores 211d-2. The subsidiary core 211d-1 touches the front side of the sheet 211c; the subsidiary core 211d-2 touches the back side of the sheet 211c; and the subsidiary core 211d-3 touches the front side of the sheet 211c. Thus, the subsidiary cores 211d-1 to 211d-3 can advance the sheet 211c while suppressing the cleaning liquid L4 supplied through the supply nozzle 1232 to the sheet 211c in the region R201 reaching the region R201.

As shown in FIG. 8, the substrate cleaning member 211 makes the sheet 211c touch the to-be-cleaned surface SBa of the substrate SB while the sheet 211c is driven to rotate via the cores 211a-1 to 211a-3. At this time, the drive mechanism 240 can drive the core 211a-1 to rotate in such a way as to push the sheet 211c against the substrate SB via the core 211a-1. By this means, the sheet 211c can be rubbed against the to-be-cleaned surface SBa of the substrate SB so as to clean the to-be-cleaned surface SBa of the substrate SB to remove particles from the to-be-cleaned surface SBa. Further, the vibrating mechanism 250 can vibrate the sheet 211c via the cores 211a-1 to 211a-3. Thus, the touching area between the sheet 211c and the substrate SB can be substantially increased, so that the capability to clean the substrate SB of the cleaning apparatus 200 can be improved.

The member cleaner 120i has a liquid supplying member 123i. That is, the member cleaner 120i supplies liquid from the liquid supplying member to the surface of the substrate cleaning member 211 to perform cleaning. The liquid supplying member supplies liquid to the surface of the substrate cleaning member (cleaning sheet) 211 in the region R202 to clean the substrate cleaning member 211. Thus, particles from the substrate SB having stuck to the sheet 211c in the region R201 can be removed in the region R202.

For example, as shown in FIG. 8, the liquid supplying member 123i has supply nozzles 1231, 1232. The supply nozzle 1231 supplies a cleaning liquid L3 to the surface (sheet 211c) of the substrate cleaning member 211 at a position on the upstream side of the region R202. The cleaning liquid L3 is a liquid for cleaning the substrate cleaning member 211, and a liquid not suitable for cleaning the substrate SB but suitable for cleaning the substrate cleaning member 211 can also be used. The cleaning liquid L3 includes at least one of, e.g., acid, alkali, a surfactant, and pure water. The surfactant includes at least one of a neutral surfactant, an acidic surfactant, and an alkaline surfactant. The supply nozzle 1232 supplies a cleaning liquid L4 to the surface (sheet 211c) of the substrate cleaning member 211 at a position on the downstream side of the region R202. The cleaning liquid L4 is a liquid for rinsing and for preventing the cleaning liquid L3 from being supplied to the substrate SB. The cleaning liquid L4 includes, e.g., pure water. Thus, while the adjacent-to-the-surface portion of the substrate cleaning member 211 is passing through the region R202, the cleaning liquid L3 is supplied through the supply nozzle 1231 thereto, and then the adjacent-to-the-surface portion is rinsed with the cleaning liquid L4 supplied through the supply nozzle 1232 to be cleaned.

The drive mechanism 240 drives each core 211a to rotate under the control of a controller 230. The direction of the rotation is, for example, the direction of rotation about the Y axis as shown in FIG. 8. The vibrating mechanism 250 vibrates each core 211a under the control of the controller 230. The direction of the vibration can be any direction and may be, for example, the Z direction as indicated by a broken-line arrow in FIG. 8. The rotary drive of each core 211a by the drive mechanism 240 and the vibration of each core 211a by the vibrating mechanism 250 can be performed in parallel.

The vibration of the cores 211a by the vibrating mechanism 250 and the vibration of the rotating shaft 132 by the vibrating mechanism 170 can be performed synchronously with each other. For example, by synchronizing the vibration of the cores 211a by the vibrating mechanism 250 and the vibration of the rotating shaft 132 by the vibrating mechanism 170 to be opposite in phase to each other, the touching area between the sheet 211c and the substrate SB can be increased efficiently.

As described above, in the second embodiment, the cleaning apparatus 200, while cleaning the substrate SB by the sheet-shaped substrate cleaning member 211 (a cleaning sheet), in parallel, cleans the substrate cleaning member 211. For example, the adjacent-to-the-surface portion of the substrate cleaning member 211 cleans the substrate SP while passing through the region R201 and is cleaned by the member cleaner 120i while passing through the region R202. Thus, particles from the substrate SB having attached to part of the sheet 211c in the region R201 can be removed in the region R202, and hence particles from the sheet 211c that attach to the substrate SB again when the part of the sheet 211c passes through the region R201 the next time can be reduced in number. As a result, the capability to clean of the cleaning apparatus 200 can be improved, so that pattern formation defects or faults such as shorts in the substrate SB can be suppressed.

Further, in the second embodiment, in the cleaning apparatus 200, the member cleaner 120i supplies liquid from the liquid supplying member 123i to the surface of the substrate cleaning member 211 (the surface of the sheet 211c) to clean the substrate cleaning member 211. Thus, particles from the substrate SB having stuck to the sheet 211c in the region R201 can be removed in the region R202.

Or either of the vibration of the cores 211a-1 to 211a-3 by the vibrating mechanism 250 and the vibration of the rotating shaft 132 by the vibrating mechanism 170 may be performed. For example, the vibration of the rotating shaft 132 by the vibrating mechanism 170 may be performed without performing the vibration of the cores 211a-1 to 211a-3 by the vibrating mechanism 250. Or, for example, the vibration of the cores 211a-1 to 211a-3 by the vibrating mechanism 250 may be performed without performing the vibration of the rotating shaft 132 by the vibrating mechanism 170.

Or the member cleaner may supply liquid from the liquid supplying member to the front side and back side of the substrate cleaning member 211 to perform cleaning, or supply liquid from the liquid supplying member to the back side of the substrate cleaning member 211 to perform cleaning.

Figure 10:
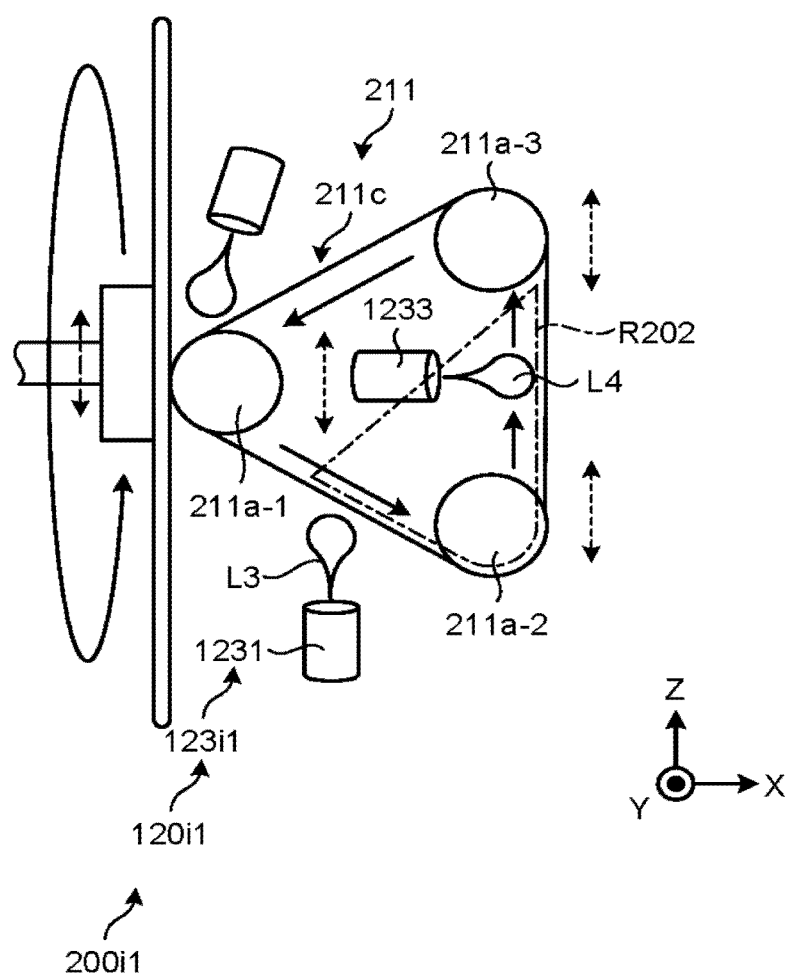
FIG. 10 is a diagram showing the configuration of a cleaning apparatus according to another modified example of the second embodiment.

For example, as shown in FIG. 10, in a cleaning apparatus 200i1, a member cleaner 120i1 has a liquid supplying member 123i1. FIG. 10 is a diagram showing the configuration of the cleaning apparatus 200. The liquid supplying member 123i1 has supply nozzles 1231, 1233. The supply nozzle 1231 supplies a cleaning liquid L3 to the surface (sheet 211c) of the substrate cleaning member 211 at a position on the upstream side of the region R202. The cleaning liquid L3 is a liquid for cleaning the substrate cleaning member 211, and a liquid not suitable for cleaning the substrate SB but suitable for cleaning the substrate cleaning member 211 can also be used. The cleaning liquid L3 includes at least one of, e.g., acid, alkali, a surfactant, and pure water. The surfactant includes at least one of a neutral surfactant, an acidic surfactant, and an alkaline surfactant. The supply nozzle 1233 is placed inward of the substrate cleaning member 211 (the sheet 211c) at a position on the downstream side of the region R202 and supplies a cleaning liquid L4 to the back side of the substrate cleaning member 211 (the back side of the sheet 211c). The cleaning liquid L4 is a liquid for rinsing and for preventing the cleaning liquid L3 from being supplied to the substrate SB. The cleaning liquid L4 includes, e.g., pure water. Thus, while the adjacent-to-the-surface portion (the sheet 211c) of the substrate cleaning member 211 is passing through the region R202, the cleaning liquid L3 is supplied through the supply nozzle 1231 thereto, and then the sheet 211c is rinsed with the cleaning liquid L4 supplied through the supply nozzle 1233 to be cleaned.

Or in the configuration shown in FIG. 10, the liquid supplying member 123i1 may have a configuration where the supply nozzle 1231 is omitted. In this case, the supply nozzle 1233 supplies the cleaning liquid L4 to the back side of the substrate cleaning member 211 (the back side of the sheet 211c) in the region R202, thereby cleaning the substrate cleaning member 211. Thus, while the adjacent-to-the-surface portion (sheet 211c) of the substrate cleaning member 211 is passing through the region R202, the cleaning liquid L4 is supplied through the supply nozzle 1233 to it, so that the sheet 211c is cleaned.

Further, the supply nozzle 1233 may be configured to pressurize and spray liquid onto the surface of the substrate cleaning member (cleaning roll) 211. That is, the supply nozzle 1233 may spray water jets, formed by jetting water finely, onto the back side of the substrate cleaning member 211 (the back side of the sheet 211c). Thus, the adjacent-to-the-surface portion (sheet 211c) of the substrate cleaning member 211 can be cleaned with the pressurized cleaning liquid L4, and hence particles attaching to the sheet 211c can be removed efficiently.

Or the member cleaner may have a gas supplying member instead of the liquid supplying member. That is, the member cleaner may supply gas from the gas supplying member to the back side of the substrate cleaning member 211 (the back side of the sheet 211c) to perform cleaning. For example, the supply nozzle 1233 shown in FIG. 10 may be configured to pressurize and spray gas onto the back side of the substrate cleaning member 211 (the back side of the sheet 211c). That is, the supply nozzle 1233 may spray gas pressurized by jetting gas finely onto the back side of the substrate cleaning member 211. Thus, the adjacent-to-the-surface portion (sheet 211c) of the substrate cleaning member 211 can be cleaned with the pressurized gas, and hence particles attaching to the sheet 211c can be removed efficiently.

Figure 11:
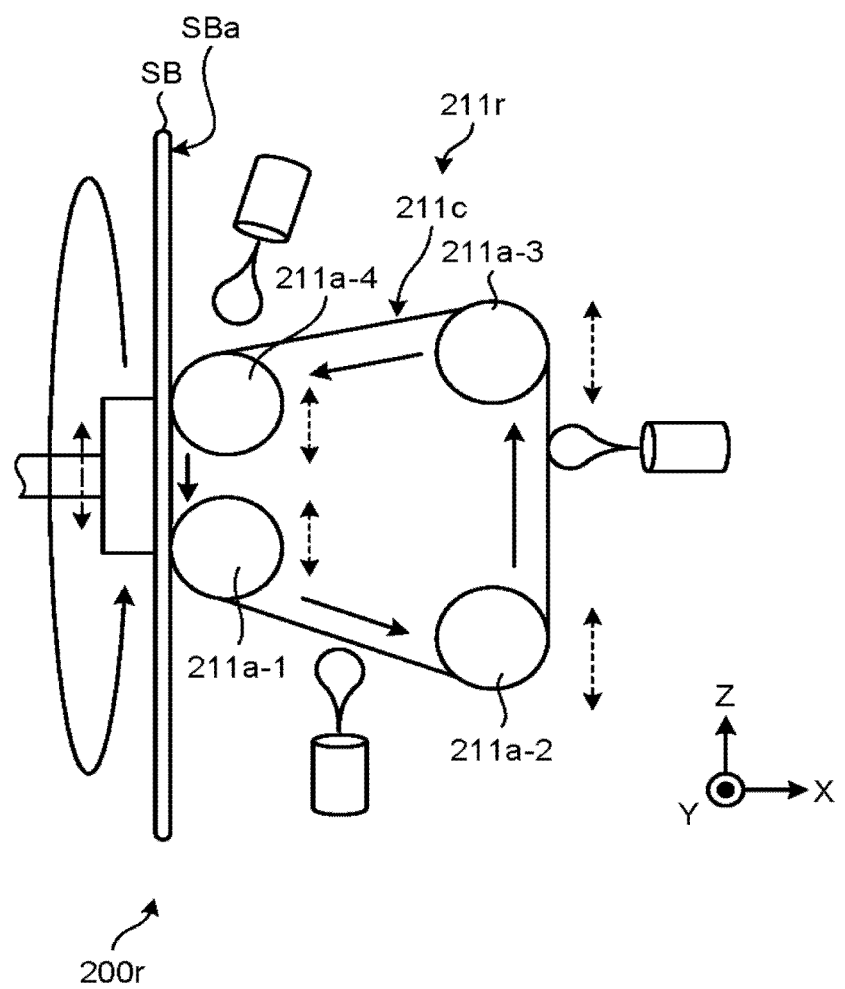
FIG. 11 is a diagram showing the configuration of a cleaning apparatus according to yet another modified example of the second embodiment.

Or, as shown in FIG. 11, in a substrate cleaning member 211r of a cleaning apparatus 200r, multiple cores 211a-1 to 211a-4 may be placed at the positions of vertexes of a polygon having a side along the to-be-cleaned surface SBa of the substrate SB in ZX cross-sectional view. FIG. 11 is a diagram showing the configuration of the cleaning apparatus 200r. For example, four cores 211a-1 to 211a-4 are placed at the positions of vertexes of a quadrangle in ZX cross-sectional view, and the side joining the cores 211a-1 and 211a-4 is along the to-be-cleaned surface SBa of the substrate SB. The sheet 211c is stretched over the outsides of the multiple cores 211a-1 to 211a-4 in such a way as to circumscribe the multiple cores 211a-1 to 211a-4. In ZX cross-sectional view, the sheet 211c forms an approximate polygon circumscribing the multiple cores 211a-1 to 211a-4 (in FIG. 11, an approximate quadrangle), and part thereof stretched over the cores 211a-1 and 211a-4 touches the to-be-cleaned surface SBa of the substrate SB. Thus, the touching area between the sheet 211c and the substrate SB can be increased, so that the capability to clean the substrate SB of the cleaning apparatus 200 can be improved.

Figure 12:
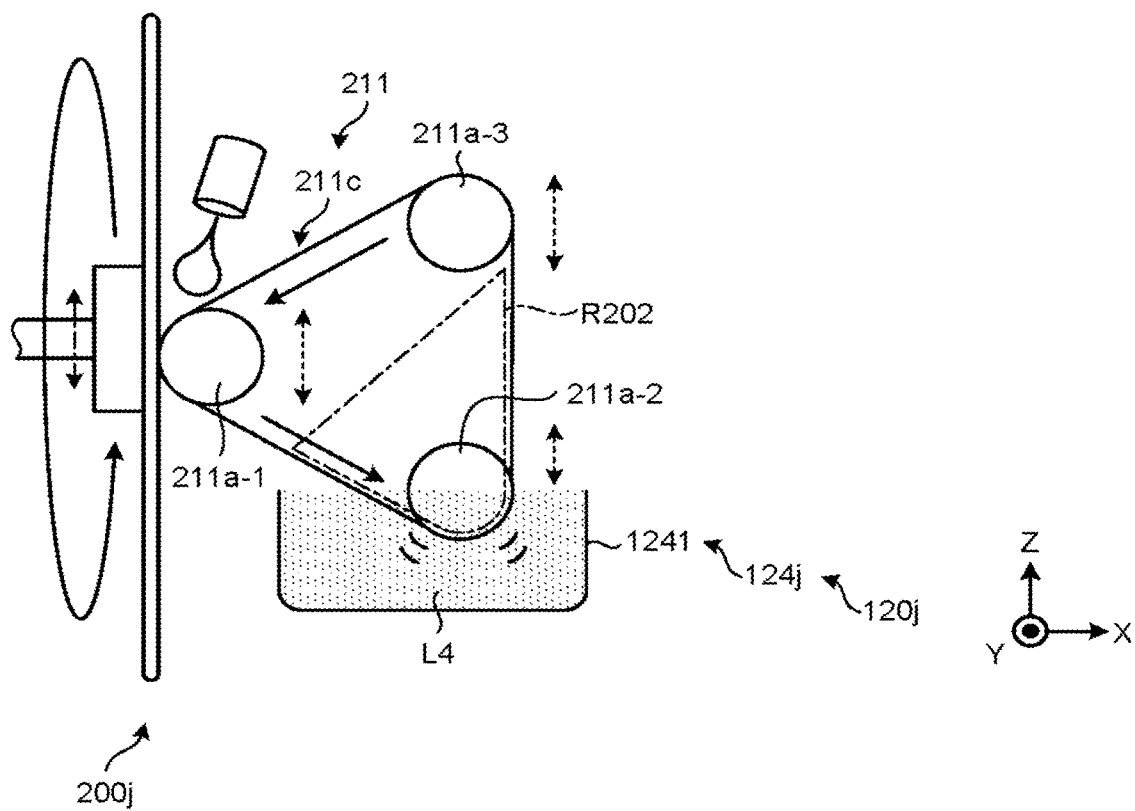
FIG. 12 is a diagram showing the configuration of a cleaning apparatus according to a modified example of the second embodiment.

Or, for example, as shown in FIG. 12, in a cleaning apparatus 200j, a member cleaner 120j has a liquid supplying member 124j. FIG. 12 is a diagram showing the configuration of the cleaning apparatus 200j. The liquid supplying member 124j includes a cleaning bath 1241. The cleaning bath 1241 is for soaking the surface of the substrate cleaning member (cleaning sheet) 211 in a liquid. The cleaning bath 1241 is filled with a cleaning liquid L4. The cleaning liquid L4 includes, e.g., pure water. The substrate cleaning member 211 is placed such that while part of the adjacent-to-the-surface portion (adjacent-to-the core 211a-2 part of the sheet 211c) of the substrate cleaning member 211 is passing through the region R202, the part is located below the liquid surface in the cleaning bath 1241 and, before and after passing through the region R202, above the liquid surface in the cleaning bath 1241. Thus, the adjacent-to-the-surface portion of the substrate cleaning member 211 is soaked in the cleaning liquid L4 in the cleaning bath 1241 to be cleaned while passing through the region R202. In this case, the substrate cleaning member 211 may have a configuration where the multiple subsidiary cores 211d-1 to 211d-3 are omitted.

Further, in the configuration shown in FIG. 12, ultrasound generated by an ultrasound generating mechanism (not shown) may be supplied to the cleaning liquid L4 in the cleaning bath 1241. Thus, the adjacent-to-the-surface portion of the substrate cleaning member 211 can be cleaned by ultrasound, and hence particles attaching to the sheet 211c can be removed efficiently.

Figure 13:
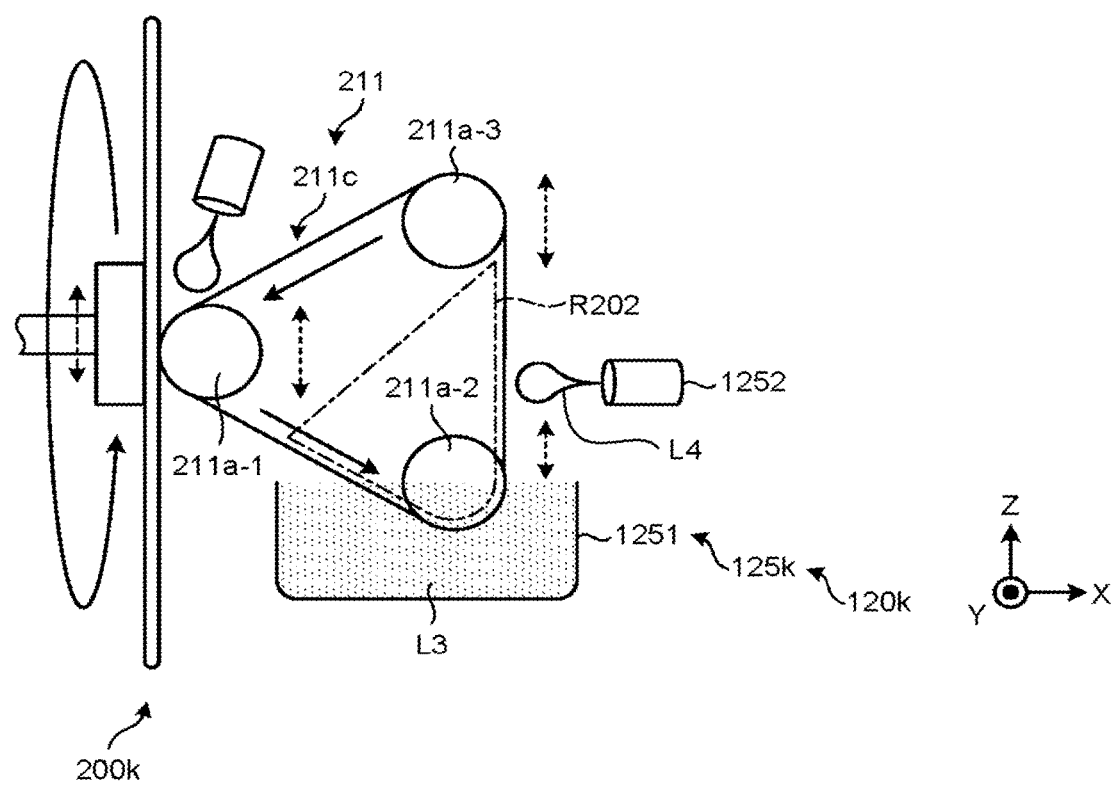
FIG. 13 is a diagram showing the configuration of a cleaning apparatus according to another modified example of the second embodiment.

Or, for example, as shown in FIG. 13, in a cleaning apparatus 200k, a member cleaner 120k has a liquid supplying member 125k. FIG. 13 is a diagram showing the configuration of the cleaning apparatus 200k. The liquid supplying member 125k includes a cleaning bath 1251 and a supply nozzle 1252. The cleaning bath 1251 is for soaking the surface of the substrate cleaning member (cleaning sheet) 211 in a liquid at a position on the upstream side of the region R202. The cleaning bath 1251 is filled with a cleaning liquid L3. The cleaning liquid L3 includes at least one of, e.g., acid, alkali, a surfactant, and pure water. The surfactant includes at least one of a neutral surfactant, an acidic surfactant, and an alkaline surfactant. The supply nozzle 1252 supplies a cleaning liquid L4 to the surface (sheet 211c) of the substrate cleaning member 211 at a position on the downstream side of the region R202. The cleaning liquid L4 is a liquid for rinsing and includes, e.g., pure water. Thus, the adjacent-to-the-surface portion (sheet 211c) of the substrate cleaning member 211 is soaked in the cleaning liquid L3 in the cleaning bath 1251 while passing through the region R202 and then rinsed with the cleaning liquid L4 to be cleaned.

Or a member cleaner 120s may perform cleaning by a touching member and cleaning by a liquid supplying member in combination.

Figure 14:
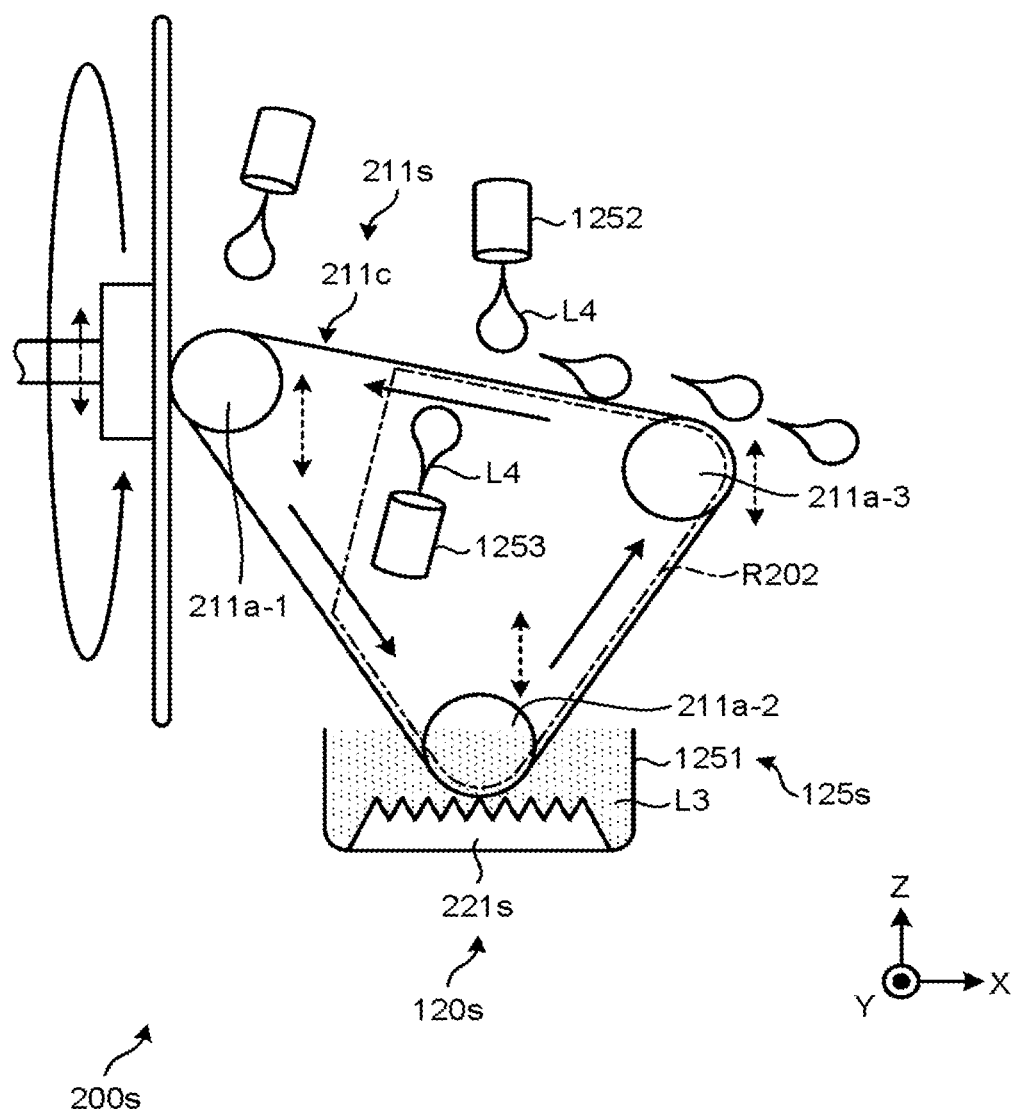
FIG. 14 is a diagram showing the configuration of a cleaning apparatus according to yet another modified example of the second embodiment.

For example, as shown in FIG. 14, in a cleaning apparatus 200s, the member cleaner 120s has a touching member 221s and a liquid supplying member 125s. FIG. 14 is a diagram showing the configuration of the cleaning apparatus 200s. The member cleaner 120s supply liquid from the liquid supplying member 125s to the surface of the substrate cleaning member 211s to clean the substrate cleaning member 211s while having the touching member 221s physically touch the surface of the substrate cleaning member 211s to clean the substrate cleaning member 211s. The liquid supplying member 125s includes a cleaning bath 1251 and supply nozzles 1252, 1253. The cleaning bath 1251 is for soaking the surface of the substrate cleaning member (cleaning sheet) 211s in a liquid at a position on the upstream side of the region R202. The cleaning bath 1251 is filled with a cleaning liquid L3, and the touching member 221s is placed therein. The touching member 221s is made of material having certain hardness. The touching member 221s is, for example, a quartz plate and can be formed basically in a plate shape having substantially the same width along the Y direction as that of the substrate cleaning member 211s and having multiple protrusions opposite the substrate cleaning member 211s. In this case, the drive mechanism 240 (see FIG. 8) can drive the core 211a-2 to rotate in such a way as to press the sheet 211c against the touching member 221s via the core 211a-2. The supply nozzle 1252 supplies the cleaning liquid L4 to the front side of the substrate cleaning member 211s (the front side of the sheet 211c) at a position on the downstream side of the region R202. The supply nozzle 1253 supplies the cleaning liquid L4 to the back side of the substrate cleaning member 211s (the back side of the sheet 211c) at a position on the downstream side of the region R202. The cleaning liquid L4 is a liquid for rinsing and includes, e.g., pure water. Thus, the member cleaner 120s can have the touching member 221s physically touch the surface (sheet 211c) of the substrate cleaning member 211s to clean the substrate cleaning member 211s. In parallel with this, the adjacent-to-the-surface portion (sheet 211c) of the substrate cleaning member 211s is soaked in the cleaning liquid L3 in the cleaning bath 1251 while passing through the region R202 and then rinsed with the cleaning liquid L4 to be cleaned.

Further, as shown in FIG. 14, in the substrate cleaning member 211s, the multiple cores 211a-1 to 211a-3 can be placed at positions corresponding to the touching member 221s and the liquid supplying member 125s in ZX cross-sectional view. For example, by placing the core 211a-3 below the core 211a-1 in ZX cross-sectional view, the cleaning liquid L4 supplied through the supply nozzles 1252, 1253 to the sheet 211c can be made to flow to the right side in FIG. 14 so that the sheet 211c is rinsed with the cleaning liquid L4.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cleaning apparatus comprising:
    a substrate cleaner having a core, a member body and a group of protrusions, the member body being fixed to the core and being placed over a first region to be in touch with a front surface of a substrate and a second region different from the first region, the group of protrusions being attached on an outer surface of the member body over the first region and the second region, the core rotating around a first rotation axis, the first rotation axis extending along a first horizontal direction, the rotation of the core causing the group of protrusions to be moved substantially along a vertical direction when being in touch with a front surface of a substrate in the first region;
    a member cleaner placed adjacent to the second region;
    a holding mechanism having a chuck and a rotation shaft, the chuck holding a back surface of the substrate in the vertical direction, the rotation shaft supporting the chuck, the rotation shaft rotating around a second rotation axis, the second rotation axis extending along a second horizontal direction, the second horizontal direction intersecting with the first horizontal direction;
    a first vibrating mechanism that vibrates the rotation shaft along the vertical direction;
    a second vibrating mechanism that vibrates the core along the vertical direction; and
    a controller that controls a synchronous vibration, wherein the vibration by the first vibrating mechanism and the vibration by the second vibrating mechanism are performed in opposite orientations along the vertical direction.

2. The cleaning apparatus according to claim 1,
    wherein the group of protrusions passes through the first region and the second region alternately and repeatedly, and
    wherein the member cleaner performs a cleanup operation on part of the group of protrusions that is passing through the second region.

3. The cleaning apparatus according to claim 2, wherein the group of protrusions cleans the substrate while passing through the first region and is cleaned up by the member cleaner while passing through the second region.

4. The cleaning apparatus according to claim 2, wherein the member cleaner has a touching member and has the touching member physically touch the group of protrusions to clean up the group of protrusions.

5. The cleaning apparatus according to claim 4, wherein the touching member includes a quartz plate.

6. The cleaning apparatus according to claim 2, wherein the member cleaner has a liquid supplying member and supplies liquid from the liquid supplying member to a surface of the group of protrusions to clean up the group of protrusions.

7. The cleaning apparatus according to claim 6, wherein the liquid supplying member includes a supply nozzle to supply the liquid to a surface of the group of protrusions.

8. The cleaning apparatus according to claim 6, wherein the liquid supplying member includes a supply nozzle to pressurize and spray the liquid onto the group of protrusions.

9. The cleaning apparatus according to claim 6, wherein the liquid supplying member includes a cleaning bath in which to soak a surface of the group of protrusions in the liquid.

10. The cleaning apparatus according to claim 2, wherein the member cleaner has a gas supplying member and supplies gas from the gas supplying member to a surface of the group of protrusions to clean up the group of protrusions.

11. The cleaning apparatus according to claim 1,
    wherein the second region is not overlapped with the substrate when seen through in a vertical direction,
    the member cleaner has:
        a first liquid supplying member arranged at an upstream portion of the second region to supply cleaning liquid to a surface of the substrate cleaner to clean up the substrate cleaner; and
        a second liquid supplying member arranged at a downstream portion of the second region to supply rinsing liquid to the surface of the substrate cleaner to remove the cleaning liquid out of the substrate cleaner.

12. The cleaning apparatus according to claim 11, wherein the first liquid supplying member includes a first supply nozzle to supply the cleaning liquid to the surface of the group of protrusions, and
    the second liquid supplying member includes a second supply nozzle to supply the rinsing liquid to the surface of the group of protrusions.

13. The cleaning apparatus according to claim 11, wherein the first liquid supplying member includes a first supply nozzle to pressurize and spray the cleaning liquid to the surface of the group of protrusions, and
    the second liquid supplying member includes a second supply nozzle to pressurize and spray the rinsing liquid to the surface of the group of protrusions.

14. The cleaning apparatus according to claim 11, wherein the first liquid supplying member includes a cleaning bath in which to soak a surface of the group of protrusions in the liquid, and
    the second liquid supplying member includes a second supply nozzle to supply the rinsing liquid to the surface of the group of protrusions.

15. The cleaning apparatus according to claim 11, wherein the cleaning liquid includes at least one of acid, alkali, a surfactant, and pure water.

16. The cleaning apparatus according to claim 1, wherein the substrate cleaner further has a first supply nozzle arranged adjacent to the first region to supply a first cleaning liquid that is used to clean the substrate.

17. The cleaning apparatus according to claim 16, wherein the member cleaner has a second supply nozzle arranged adjacent to the second region to supply a second cleaning liquid that is used to clean the group of protrusions.

18. The cleaning apparatus according to claim 17,
wherein the second supply nozzle is arranged adjacent to an upstream portion of the second region,
the member cleaner further has a third supply nozzle arranged adjacent to an upstream portion of the second region to supply a rinsing liquid that is used to rinse the group of protrusions.

* * * * *